United States Patent
Pruneri et al.

(10) Patent No.: US 9,548,435 B2
(45) Date of Patent: Jan. 17, 2017

(54) ELECTRONIC PLATFORM COMPRISING AN $ABO_3$ TYPE CRYSTAL AND GRAPHENE, METHOD FOR ITS MANUFACTURE AND CHIP COMPRISING THE SAME

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(72) Inventors: Valerio Pruneri, Castelldefels (ES); Frank Koppens, Castelldefels (ES); Davide Janner, Castelldefels (ES); Fabio Gatti, Castelldefels (ES)

(73) Assignees: FUNDACIÓ INSTITUTE DE CIÈNCIES FOTÒNIQUES PARQUE MEDITERRANEO DE LA TECNOLOGIA, Castelldefels (ES); INSTITUCIO CATALANA DE RECERCA I ESTUDIS AVANCATS, Barcelona (ES)

( * ) Notice: Subject to any disclaimer, the term of this patent is extended or adjusted under 35 U.S.C. 154(b) by 34 days.

(21) Appl. No.: 14/429,332

(22) PCT Filed: Sep. 18, 2013

(86) PCT No.: PCT/EP2013/069351
§ 371 (c)(1),
(2) Date: Mar. 18, 2015

(87) PCT Pub. No.: WO2014/044702
PCT Pub. Date: Mar. 27, 2014

(65) Prior Publication Data
US 2015/0236234 A1  Aug. 20, 2015

(30) Foreign Application Priority Data

Sep. 18, 2012 (ES) .................................. 201231444

(51) Int. Cl.
*H01L 39/00* (2006.01)
*H05K 1/03* (2006.01)
(Continued)

(52) U.S. Cl.
CPC ............... *H01L 39/005* (2013.01); *H01B 1/02* (2013.01); *H01B 1/04* (2013.01); *H01B 12/02* (2013.01);
(Continued)

(58) Field of Classification Search
CPC ...... H01L 39/145; H01L 39/146; H01L 39/22; H01L 39/223; H01L 39/226; H01L 39/228; H01L 39/2493; H01L 39/005; H01L 39/125; H01B 1/02; H01B 1/04; H01B 12/02; H05K 1/09; H05K 1/0306; Y10T 428/30

See application file for complete search history.

(56) References Cited

U.S. PATENT DOCUMENTS

| | | | |
|---|---|---|---|
| 2012/0116228 A1 | 5/2012 | Okubo | |
| 2012/0326128 A1* | 12/2012 | Shin | H01L 21/02378 257/29 |
| 2013/0048952 A1* | 2/2013 | Chen | B82Y 30/00 257/29 |

FOREIGN PATENT DOCUMENTS

| | | |
|---|---|---|
| CN | 102544530 A | 7/2012 |
| JP | 2011178644 A | 9/2011 |

OTHER PUBLICATIONS

Spanish Search Report mailed Jan. 17, 2013 in Spanish patent application No. 2395949.
(Continued)

*Primary Examiner* — Julio J Maldonado
*Assistant Examiner* — Stanetta Isaac
(74) *Attorney, Agent, or Firm* — Polsinelli PC

(57) ABSTRACT

An electronic platform comprising a substrate made of a ABO3 crystal (2) and at least one layer of a two-dimensional conducting sheet of carbon atoms (1) of a thickness between one and four atoms, characterized in that the conducting layer(s) is (are) placed on top of a face of the crystal whose orthogonal axis is at an angle up to 35° of the crystal's spontaneous polarization or c-axis. The invention achieves a sheet resistance lower than 1 Ω/square at temperatures higher than 77K.

11 Claims, 8 Drawing Sheets

(51) Int. Cl.
  *H05K 1/09* (2006.01)
  *H01B 1/02* (2006.01)
  *H01B 12/02* (2006.01)
  *H01B 1/04* (2006.01)
  *H01L 39/12* (2006.01)
  *H01L 39/22* (2006.01)

(52) U.S. Cl.
  CPC ........... *H01L 39/125* (2013.01); *H01L 39/223* (2013.01); *H05K 1/0306* (2013.01); *H05K 1/09* (2013.01); *Y10T 428/30* (2015.01)

(56) References Cited

OTHER PUBLICATIONS

Strikha M. V., Non-volatile memory and IR radiation modulators based upongraphene-on-ferroelectric substrate. A review, V. Lashkaryov Institute of Semiconductor Physics, National Academy of Science of Feb. 29, 2012, Ukr. J. Phys. Opt., V. 13, Suppl. 3 Sci. Horiz, Ukraine.
Profeta, Gianni et al., Phonon-mediated superconductivity in graphene by lithium deposition, Nature Physics, vol. 8, Published Online: Jan. 10, 2012 | DOI: 10.1038/NPHYS2181.
Savini, G. et al., First-Principles Prediction of Doped Graphane as a High-Temperature Electron-Phonon Superconductor, Physical Review Letters, Jul. 15, 2010, The American Physical Society, PRL 105, 037002 DOI: 10.1103/PhysRevLett.105.037002.
International Search Report and Written Opinion mailed Jan. 30, 2014; in PCT patent application No. PCT/EP2013/069351.
Chivukula V. et al ; "Detecting of $CO_2$ absorption in graphene using surface acoustic waves", Ultrasonics Symposium (IUS), 2010 IEEE, Oct. 11, 2010, pp. 257-260, XP031953065.
Miseikis V. et al.; Acoustically induced current flow in graphene, Applied Physics Letters, American Institute of Physics, US, vol. 100, No. 13, Mar. 26, 2012, pp. 133105-133105, XP012155412.
A Ballestar et al.; Electric Field induced superconductivity in multigraphene; Feb. 15, 2012, XP055096245, retrieved from the internet URL: http://arxiv.org/abs/1202.3327.

* cited by examiner

Carbon

ELECTRONIC PLATFORM COMPRISING AN ABO₃ TYPE CRYSTAL AND GRAPHENE, METHOD FOR ITS MANUFACTURE AND CHIP COMPRISING THE SAME

FIELD OF THE INVENTION

The present invention relates to electronic and optoelectronic devices showing very low electrical resistance, more in particular, to superconductive devices comprising graphene and $ABO_3$ crystals.

STATE OF THE ART

Recently graphene, a honeycomb bi-dimensional Carbon monolayer (FIG. 1), has become a prominent material of research given its unique properties, including mass-less Dirac behavior for the electrons, quantum hall effect, a minimum conductivity even when the carrier density tends to zero, a high electronic mobility independent of the level of doping for a quite large range and a uniform (2.3%) absorption over the full optical spectral range, impermeability against oxygen, water and helium, high elastic strength. Last but not least, it presents the possibility to tune the electronic and optical properties by changing the level of doping through electric fields. Since the preparation of high quality flakes in 2004 using mechanical exfoliation, several electronic and photonic devices have been realized, including high frequency transistors, liquid crystal displays, high efficiency photodetectors, resonating membranes and organic solar cells. The future industrialization of the graphene containing devices significantly depends on the availability of large graphene sheets with high quality on the appropriate substrate. Another crucial aspect for most of the applications is being able to induce doping in graphene and change its electrical and optical properties. For example an undoped graphene layer has a typical sheet resistance of >1000 ohm/square, making the doping necessary for most of the electric and electronic applications. The electrical properties of graphene also depend significantly on the substrate. For example suspended graphene as well as graphene on hexagonal boron nitride typically show a conductivity one order of magnitude larger than graphene on glass. The improved electrical performance of graphene on crystalline boron nitride is mainly due to a lower surface roughness and the interactions at the interface with the substrate, thanks to the matching of the graphene lattice with the hexagonal boron nitride. It has also been theoretically shown that graphene can become superconductive if properly intercalated by lithium atoms, though with very low (about 10K) critical temperatures [G. Profeta et al., Nature Physics vol. 8, p. 131 (2012)]. In another theoretical work [G. Savini et al., Phys. Rev. Lett. Vol. 105, p. 037002 (2010)] it has been shown that hydrogenated graphene (graphane) when properly doped with holes at levels higher than $10^{14}$ cm$^{-2}$ can become superconductive at 90K.

Supercurrent in graphene (superconducting proximity effect) was observed experimentally at lower level of carrier density when superconducting contacts were used in a Josephson junction configuration [H. B. Heershe et al., Nature 446, p. 56 (2007)].

SUMMARY OF THE INVENTION

The present invention aims to achieve an electronic or optoelectronic platform with sheet resistance lower than 1 Ω/square, at higher temperatures as in the prior art, that is, higher than 77K.

For this purpose, the invention comprises an electronic platform comprising a substrate made of a $ABO_3$ crystal and at least one layer of a two-dimensional conducting sheet of carbon atoms of a thickness between one and four atoms, wherein the conducting layer are placed on top of a face of the crystal whose orthogonal axis is at an angle up to 35° of the crystal's spontaneous polarization axis (usually called c-axis or c-cut). The crystal can be $LiNbO_3$, $LiTaO_3$, $LiIO_3$, $Ba_xSr_{1-x}TiO_3$, $Pb(Zr_xTi_{1-x})O_3$, with x varying between 0 and 1. Optionally, the graphene layer is shaped as Hall bars and the platform comprises gold contacts of a thickness of 10 to 1000 nm. The invention also comprises a chip platform with a layer of chromium of a thickness of 1 to 50 nm between the graphene layer and the gold contacts.

BRIEF DESCRIPTION OF THE DRAWINGS

To complete the description and in order to provide for a better understanding of the invention, a set of drawings is provided. Said drawings illustrate a preferred embodiment of the invention, which should not be interpreted as restricting the scope of the invention, but just as an example of how the invention can be embodied. The drawings comprise the following figures.

DESCRIPTION OF THE INVENTION

Figure 1:
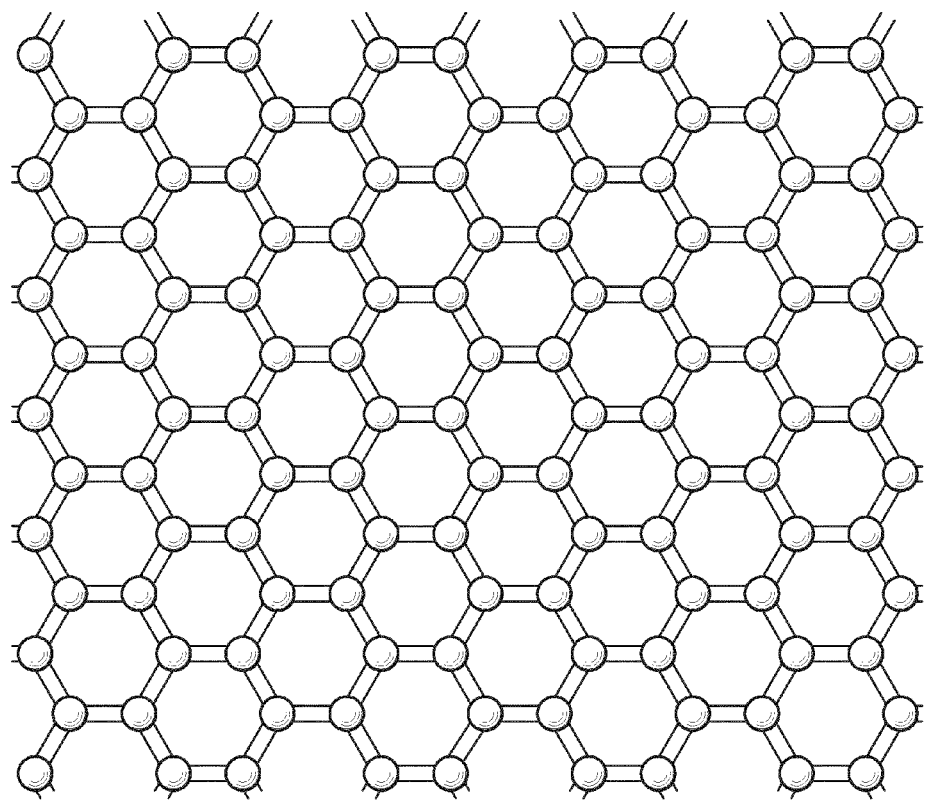
FIG. 1 shows the hexagonal structure of graphene with Carbon atoms distance of about 0.142 nm.
Figure 2:
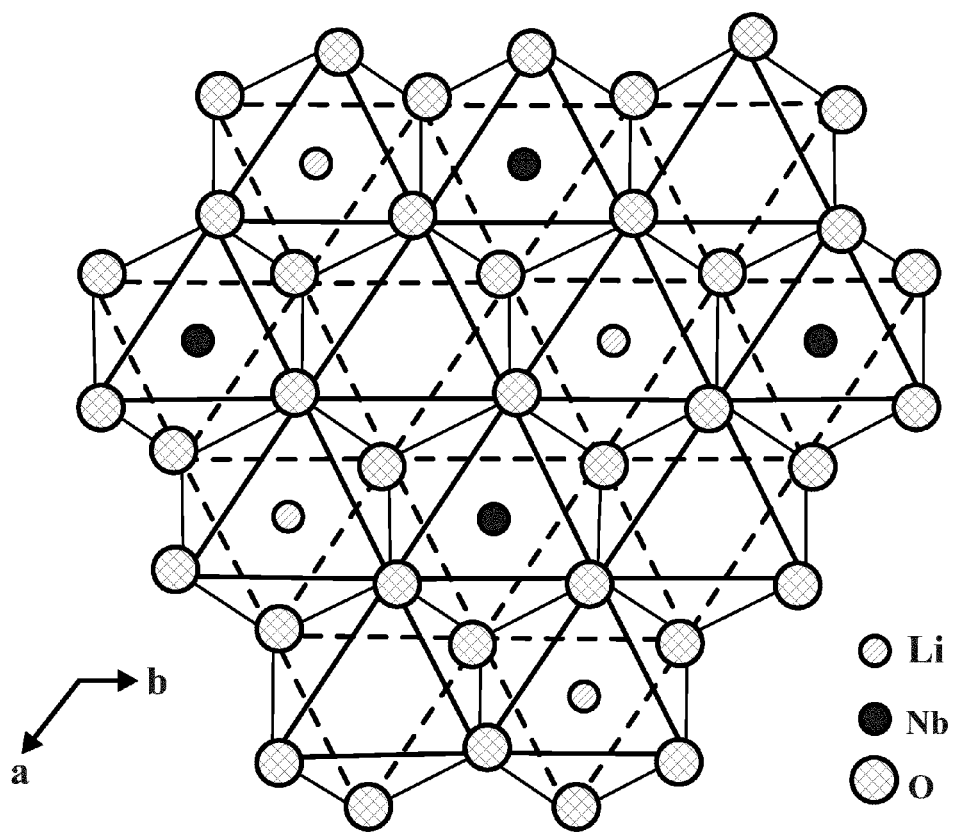
FIG. 2 shows the octahedra linking conditions of constituent atoms of $LiNbO_3$ crystals in the ab crystallographic plane.
Figure 3:
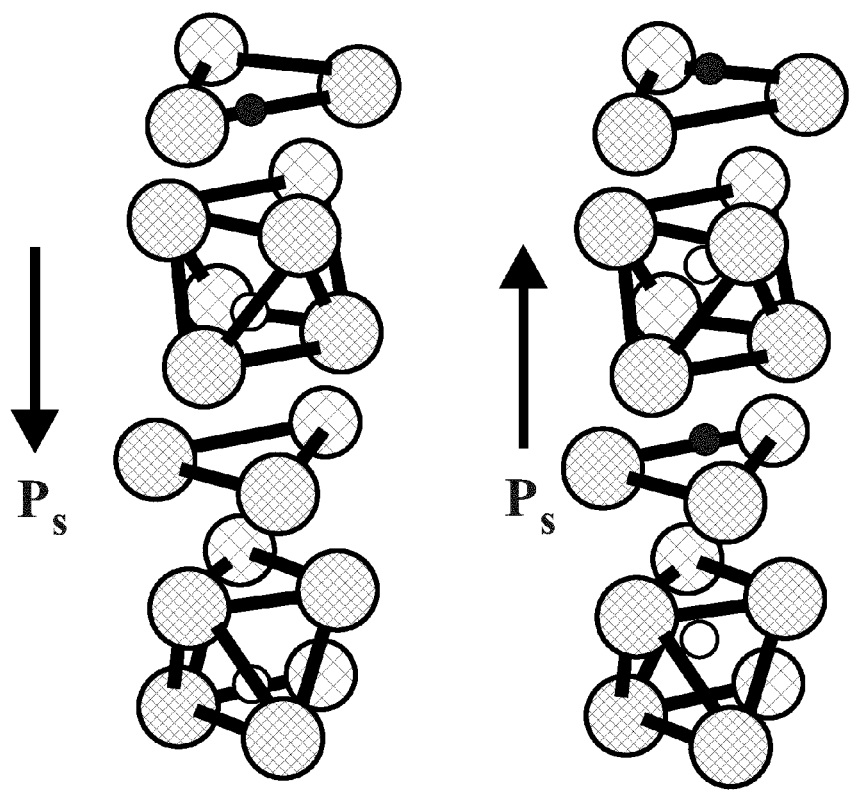
FIG. 3 is a side view of $LiNbO_3$ crystals with opposite spontaneous polarization ($P_s$).

The invention is based on the following effect: The crystal structure of $LiNbO_3$ consists of distorted oxygen octahedra by sharing their corners, faces and edges along different crystallographic directions, forming a trigonal (c-axial) lattice. Along the c-axis (the ideal cation stacking sequence along the trigonal axis is □-Li—Nb-□-Li—Nb-□-□ where □ indicates a vacancy) each octahedron shares its oxygen planes with the neighboring upper and lower ones. In the ab plane, perpendicular to the c-axis, each octahedron shares its oxygen edges with the neighboring ones (FIG. 2). In FIG. 2 we can see that each octahedron is surrounded by other six octahedra, e.g. each $LiO_6$ octahedron is surrounded by three □$O_6$ octahedra and three $NbO_6$ octahedra [D. Xue et al., Journal of Physics and Chemistry of Solids vol. 66, p. 589 (2005)]. $LiNbO_3$ in its ferroelectric phase has a spontaneous electrical polarization ($P_s$) of about 0.72 C/m² along the c-axis. The ferroelectric state is characterised by a hysteresis effect of the electrical polarization as a function of the applied electric field, making the crystal possess $P_s$ in the absence of an external electrical field. A region of the crystal with uniform $P_s$ is called domain. The crystal is called single domain or single crystal when it has the same $P_s$ through the whole volume. Note that $LiNbO_3$ can also have either a paraelectric phase whereby there are no regions with $P_s$ or a multidomain crystal structure consisting of domain regions oriented in a random or predefined manner. In a simplified picture the side view of the structure of ferroelectric $LiNbO_3$ is represented in FIG. 2. Note that the $Li^+$ ions are positioned on opposite sides of the oxygen planes while the $Nb^{5+}$ ions are in between oxygen planes. It is also known that one can switch the spontaneous polarization, e.g. create opposite domain regions or orient all the domains in the same direction (form a single domain structure) by applying high electric fields, of the order of 20 kV/mm at room temperature. During this process, named electric-field domain inversion or poling, the $Li^+$ ions move across the oxygen planes while the $Nb^{5+}$ ions are displaced between two consecutive oxygen planes, and the distances between the atoms change [X. Zhang et al., Materials Science and Engineering B vol. 120, p. 21 (2005)]. FIG. 3 shows the ferroelectric $LiNbO_3$ structure of oppositely oriented domains (up and down spontaneous polarization). $LiNbO_3$ also possesses pyroelectric, piezoelectric, photorefractive and nonlinear optical properties. The pyroelectric effect consists in a change of the spontaneous polarization upon temperature and it is characterised by the pyroelectric coefficient ($p_i$) which, for $LiNbO_3$, is about $-4\times10^{-5}$ C/(m$^2$K). In reality $p_i$ depends on temperature as it is shown by Y. V. Shaldinfor the range below 300K [Y. V. Shaldin, Crystallography Reports vol. 53, p. 847 (2008)]. When the temperature changes the $Li^+$ and $Nb^{5+}$ ions move with respect to the oxygen planes. In particular when the temperature decreases the $Li^+$ and $Nb^{5+}$ ions move further toward the c+ face, i.e. $P_s$ increases and the c+ face becomes more positive while the c− face becomes more negative. The opposite happens when the temperature is increased. The created polarization bound charge induces internal electric fields of about 0.15 kV/(mm K), if the change in temperature is fast enough not to allow free charges to arrive on the surface and thus compensate for the induced polarization charges. Note that the pyroelectric effect produces the largest charge density on the face of the crystal when it is cut such that the face is orthogonal to the c-axis, i.e. the angle between the orthogonal axis to the face and the c-axis is zero. The pyroelectric effect at low temperature (<300K) has been investigated showing that the electric fields induced might generate internal electrical breakdown, thus providing extra free charge and different screening situations for the spontaneous polarization [S. L. Bravina et al., Ferroelectrics vol. 298, p. 31 (2004)]. When the temperature variation is sufficiently fast and large (e.g. 100K) the internal electric fields due to the pyroelectric effect might reach values close to the coercive field of the crystal, i.e. the field needed to switch the domains (spontaneous polarization). In that case, as it happens for domain inversion by applying external electrical fields, the polarization charge change can reach values of 1.44 C/m$^2$.

The piezoelectric effect consists in a change of spontaneous polarization due to application of pressure (stress) for example through a mechanical deformation. As it is the case of the pyroelectric effect polarization charges are induced.

Note that when the spontaneous polarization changes, be it for example through the pyroelectric, piezoelectric or domain inversion, bound charges are generated which create electric fields. This is always accompanied by the attraction or generation of free charges which compensate (neutralize) the bound charges. The speed of the charge compensation (neutralization) depends on the effect and external conditions. For example the process is slow in vacuum in the case of the pyroelectric effect and it is practically instantaneous in the case of domain inversion by applying external electric fields using voltage generators, which also provide the free charges.

Superconductivity requires strong interactions between charge carriers and lattice vibrations (phonons). $LiNbO_3$ as well as other ferro-electric materials carry optical phonon modes which are strongly coupled to the electronic degree of freedom. In addition, the lithium ions under temperature changes become very reactive and mobile, thus increasing the chance of intercalation in the graphene. In the presence of strong electrical fields, the ABO3 crystals could show a superconductive behaviour (K. Ueno et al., Nature Materials vol. 7 page 855 (2008)).

Other ferroelectric $ABO_3$ crystals possess properties similar to $LiNbO_3$ and could be used for the purpose of the invention. These include $LiTaO_3$, $LiIO_3$, $Ba_xSr_{1-x}TiO_3$, $Pb(Zr_xTi_{1-x})O_3$, with x varying between 0 and 1.

Figure 4:
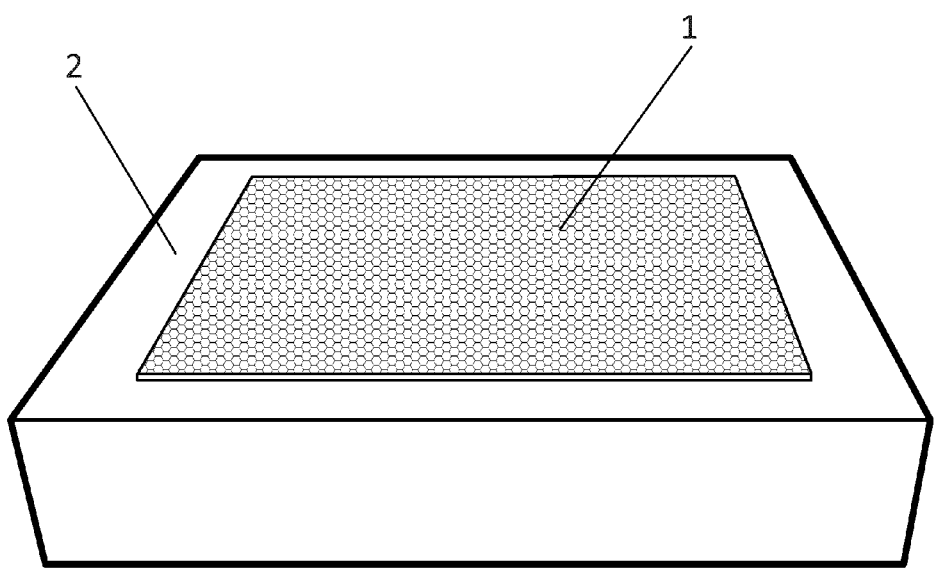
FIG. 4 shows a graphene layer on a c-cut $LiNbO_3$ crystal according to the invention.
Figure 5:
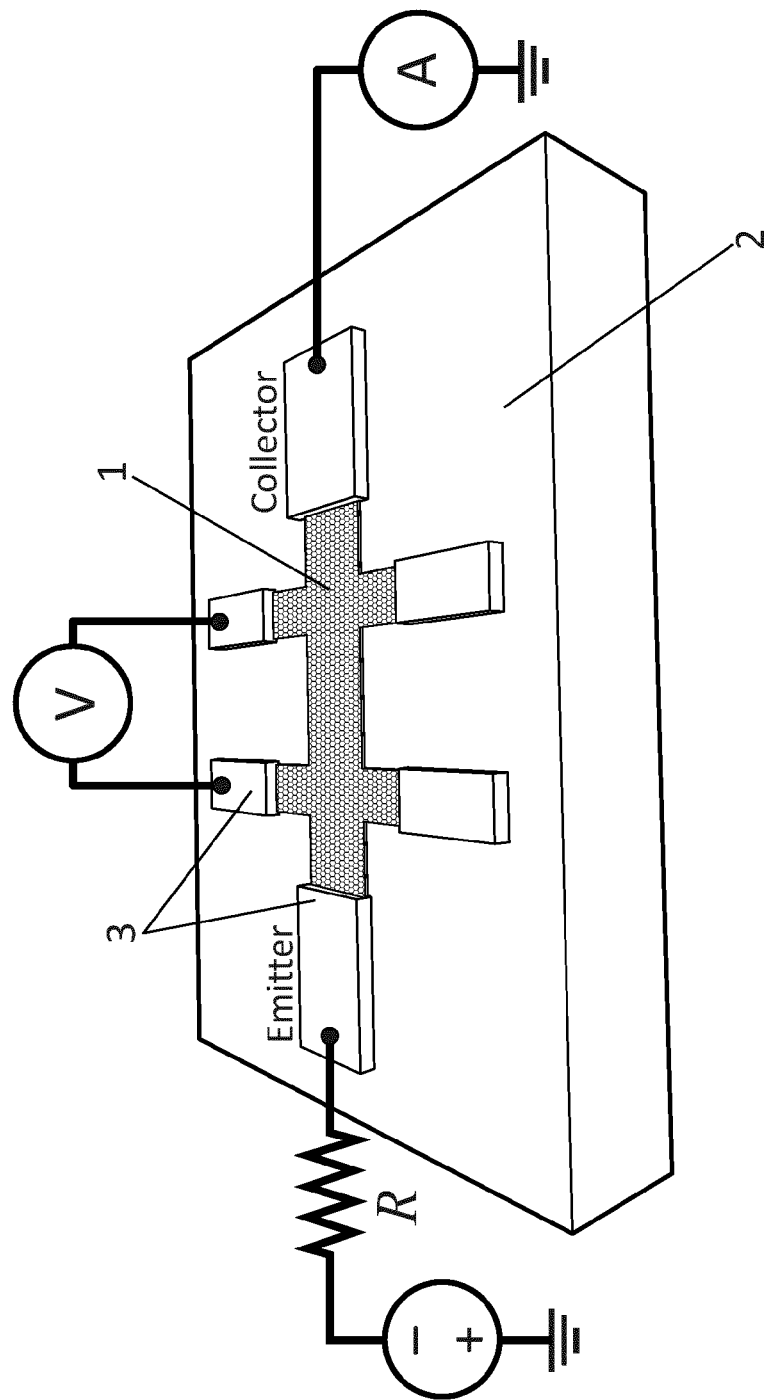
FIG. 5 depicts an embodiment of the inventions of the graphene on $LiNbO_3$ chip layout, electrical measurements set up in the cryogenic environment.
Figure 6:
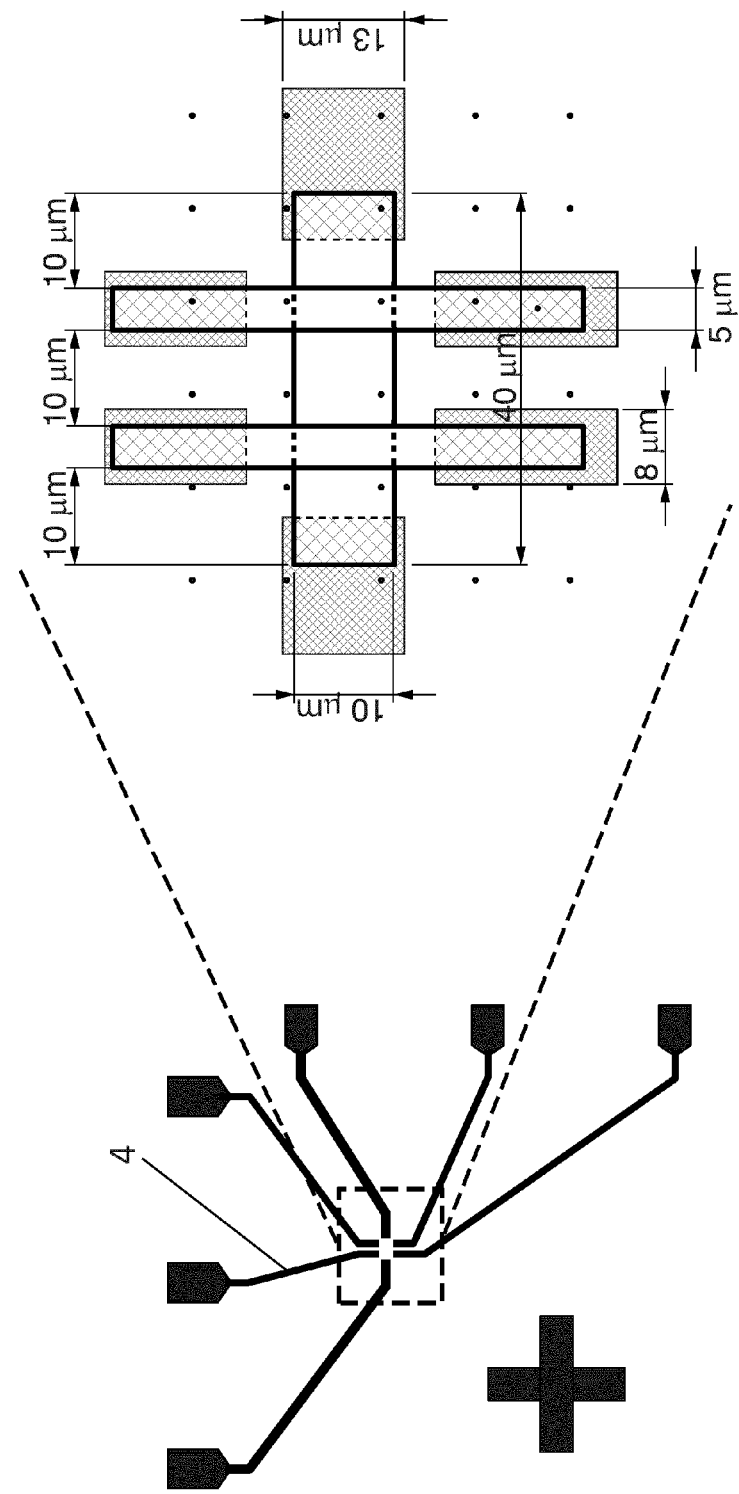
FIG. 6 shows an embodiment of the invention provided with contacts made of gold and the graphene in the shape of Hall bars.

An embodiment of the electronic or optoelectronic platform according to the invention can be seen in FIGS. 4 to 6. A two-dimensional conductor consisting of a sheet of carbon atoms with a thickness of one to 4 atoms is deposited on a face of a lithium niobate crystal prepared by known means with a face whose orthogonal axis is up to 35° oriented with respect to the c-axis of the crystal The fabrication process of the devices starts with the cleaning of the lithium niobate substrates employing well known procedure in semiconductor fabrication both wet (e.g acetone and isopropanol sonication, cleaning in an alkaline soap, $NH_4OH:H_2O_2:H_2O$ solution) and dry (e.g. plasma cleaning with oxygen). After substrate preparation, graphene can be deposited by known techniques directly on top of the substrate surface either before the electrical contact fabrication or after their deposition. One or a plurality of atom thick layers (each between 0.3 and 0.4 nm thick) are deposited. The fabrication of the contacts is typically made by physical vapor deposition techniques (e.g evaporation, sputtering etc.) by depositing for instance a layer of chromium, titanium or nickel with a thickness ranging from 1 to 50 nm and on top of it a layer of gold having a thickness ranging from 10 to 1000 nm. The patterning of graphene to obtain the desired shape, e.g. hall bars with typical dimensions as in FIG. 6, is carried out by first depositing a very thin layer of a protecting material, typically an aluminum layer ranging from 1 to 20 nm, most commonly 3 nm. After the protective layer deposition, the pattern of the device is defined by resist photolithography. After the development the photoresist remains on top of the graphene to protect it during the following step. The unprotected graphene is etched away in a reactive ion etching oxygen plasma system with techniques well known in the literature and the final shapes of the graphene layer obtained. After this step the resist can be left as a protection in the case of graphene on top of the contacts or removed to further proceed with the fabrication. After the fabrication process the chip is inserted into a cryogenic chamber in vacuum where it is electrically connected according to the scheme in FIG. 5. Note that the external resistance R in the figure is much larger than the resistance of the graphene layer between the two points where the voltage V is measured. The typical value of that resistance is R=1 Mohm in order to obtain a current of the order of I=1 μA when the generator is set to 1 V. To obtain the resistance value of the graphene a four point probe measurement technique can be used as indicated in FIG. 5 and it is calculated by dividing the voltage V measured by the voltage probes by the current I.

Figure 7:
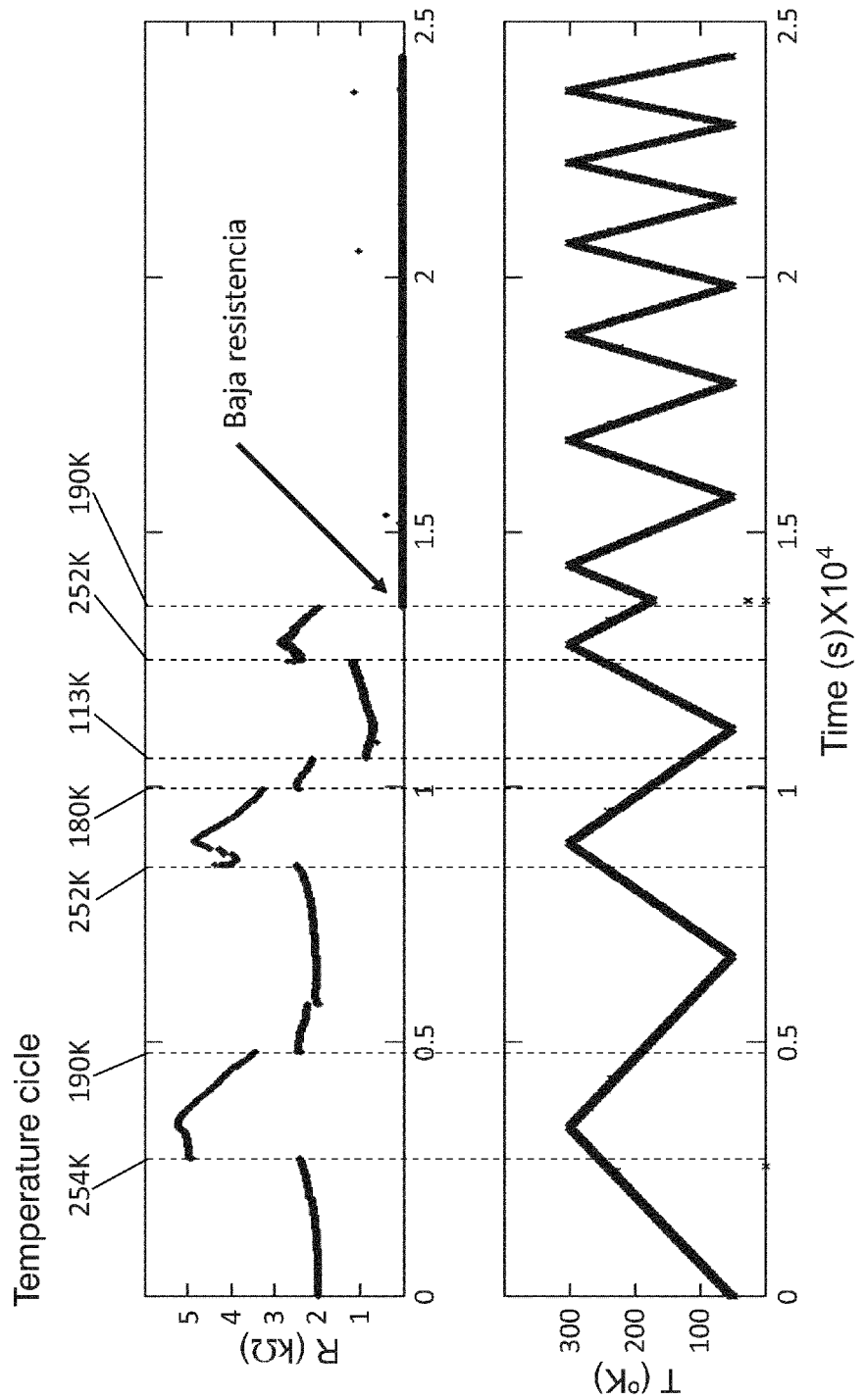
FIG. 7 is a graph of the temperature cycle inducing anomalously low electrical resistance in the graphene on $LiNbO_3$
Figure 8:
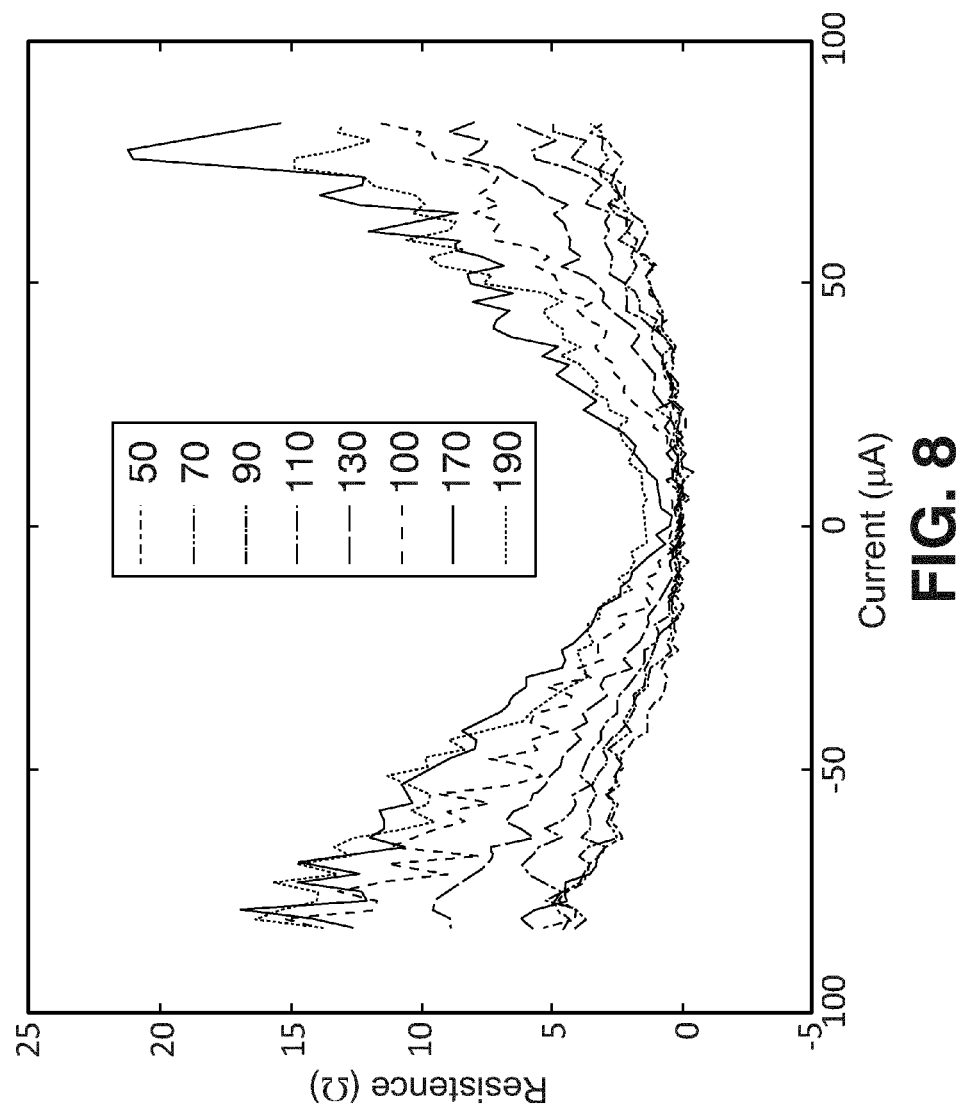
FIG. 8 is a graph of the resistance as a function of current at different temperatures after the thermal cycle of FIG. 7.

An important step in order to obtain a very low resistance device includes a process, e.g. pyroelectric effect, piezoelectric effect, domain inversion, that can induce changes in the spontaneous polarization, thus bound charges in proximity to the crystal's surface and the graphene layer. As a consequence free charges are drawn into the graphene layer which increases their electrical conductivity. For example the process can rely on the pyroelectric effect by a thermal cycling applied in the cryostat. In FIG. 7 it is shown that a proper thermal cycling (bottom) induces jumps in the measured resistance until this reaches stably a value close to zero. The cycle consists at least of a decrease of at least 1K/min from room temperature to a temperature below the critical temperature, i.e. the temperature at which the transition from normal to low electrical resistance state occurs, e.g. about 170-180K in our case. The cycle can also consists of a number of cycles to induce the low resistance state, with a temperature ranging from a minimum of 1K to a maximum of 600K, being typically between 10K to 300K. The number of cycles needed to induce the low resistance state can range from 1 to 100 with a typical value of 5 while the temperature ramp rate can range from 1K/min to 15K/min being typically 5K/min. Note that after being reached the low resistance state is maintained during subsequent cycles. FIG. 8 shows that the designed platform reached practically zero electrical resistance and the range over which it is maintained close to zero reduces for increasing temperature. At a temperature around 170-180K this range becomes negligible and correspondingly the resistance starts increasing (deviating from zero). The initial resistance before the thermal cycling was about 21M, after the thermal cycle in the low resistance state (below 170-180K) the resistance becomes lower than 50 mΩ and in the normal resistance state (above 170-180K) is always less than 205Ω. The latter value corresponds to a level of doping (carrier concentration) in graphene of the order of $10^{14}$ cm$^{-2}$.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

The invention claimed is:

1. An electronic platform comprising a substrate made of a ABO$_3$ crystal and at least one layer of a two-dimensional conducting sheet of carbon atoms of a thickness between one and four atoms, characterized in that the at least one layer of a two-dimensional conducting sheet of carbon atoms is placed on top of a face of the crystal whose orthogonal axis is at an angle up to 35° of the crystal's spontaneous polarization or c-axis.

2. An electronic platform according to claim 1 wherein the substrate is made of at least one of LiNbO$_3$, LiTaO$_3$, LiIO$_3$, Ba$_x$Sr$_{1-x}$TiO$_3$, Pb(Zr$_x$Ti$_{1-x}$)O$_3$, with x varying between 0 and 1.

3. An electronic platform according to claim 2 wherein the at least one layer of a two-dimensional conducting sheet of carbon atoms is shaped as Hall bars.

4. A chip comprising the electronic platform according to claim 3 and gold contacts of a thickness of 10 to 1000 nm.

5. A chip according to claim 4 further comprising a layer of chromium of a thickness of 1 to 50 nm between the at least one layer of a two-dimensional conducting sheet of carbon atoms and the gold contacts.

6. A chip comprising the electronic platform according to claim 2 and gold contacts of a thickness of 10 to 1000 nm.

7. A chip according to claim 6 further comprising a layer of chromium of a thickness of 1 to 50 nm between the at least one layer of a two-dimensional conducting sheet of carbon atoms and the gold contacts.

8. An electronic platform according to claim 1 wherein the at least one layer of a two-dimensional conducting sheet of carbon atoms is shaped as Hall bars.

9. A chip comprising the electronic platform according to claim 1 and gold contacts of a thickness of 10 to 1000 nm.

10. A chip according to claim 9 further comprising a layer of chromium of a thickness of 1 to 50 nm between the at least one layer of a two-dimensional conducting sheet of carbon atoms and the gold contacts.

11. A process for fabricating an electronic platform comprising a substrate of a crystal of the form ABO$_3$ and at least one layer of a two-dimensional conducting sheet of carbon atoms of a thickness between one and four atoms, the method comprising the steps of depositing the at least one layer of a two-dimensional conducting sheet of carbon atoms on top of a face of the crystal whose orthogonal axis is at an angle up to 35° of the crystal's spontaneous polarization or c-axis, subjecting the at least one layer of a two-dimensional conducting sheet of carbon atoms and the substrate to a process of change of spontaneous polarization.

* * * * *